United States Patent [19]

Larrabee

[11] Patent Number: 4,631,234

[45] Date of Patent: Dec. 23, 1986

[54] GERMANIUM HARDENED SILICON SUBSTRATE

[75] Inventor: Graydon B. Larrabee, Dallas, Tex.

[73] Assignee: Texas Instruments Incorporated, Dallas, Tex.

[21] Appl. No.: 775,885

[22] Filed: Sep. 13, 1985

[51] Int. Cl.[4] ............................................. H01L 21/20
[52] U.S. Cl. .................................... 428/428; 428/700; 156/617 R; 156/617 SP; 156/621; 156/624
[58] Field of Search ............... 428/428, 446, 700, 701; 156/617 R, 617 SP, 621, 624

[56] References Cited

U.S. PATENT DOCUMENTS

| | | | |
|---|---|---|---|
| 4,046,954 | 9/1977 | Ehman et al. | 428/446 |
| 4,126,880 | 11/1978 | Tamaki et al. | 357/54 |
| 4,177,321 | 12/1979 | Nishizawa | 428/446 |
| 4,178,415 | 12/1979 | Ovshinsky et al. | 428/446 |
| 4,374,391 | 2/1983 | Camlibel et al. | 357/17 |
| 4,442,178 | 4/1984 | Kimura et al. | 428/446 |

FOREIGN PATENT DOCUMENTS 0018191  1/1984  Japan ..................................... 36/203

*Primary Examiner*—John E. Kittle
*Assistant Examiner*—Patrick J. Ryan
*Attorney, Agent, or Firm*—Carlton H. Hoel; James T. Comfort; Melvin Sharp

[57] ABSTRACT

Disclosed is a substitutionally strengthened silicon semiconductor material. A high concentration of germanium atoms is added to a silicon melt to thereby substitutionally displace various silicon atoms throughout the crystalline structure. The germanium atoms, being larger than the silicon atoms, block crystalline dislocations and thus localize such dislocations so that a fault line does not spread throughout the crystalline structure. In heavily boron doped P+ silicon substrates, the larger germanium atoms offset the crystalline shrinkage caused by the boron atoms, thereby equilibrating the silicon crystal size.

14 Claims, No Drawings

GERMANIUM HARDENED SILICON SUBSTRATE

TECHNICAL FIELD OF THE INVENTION

The present invention relates in general to semiconductor materials, and more particularly relates to methods of processing semiconductor substrates for increased strength.

BACKGROUND OF THE INVENTION

Because of the superior properties of silicon as a semiconductor material, it has become the established standard for substrates in the integrated circuit industry. The fabrication of high purity monocrystalline silicon material is well known in the art. Indeed, four-inch and five-inch silicon slices or wafers are commonly used for fabricating thousands of integrated circuits thereon.

The trend is toward the use of larger diameter slices for accommodating a corresponding larger number of integrated circuits. It is preferable to achieve this goal without substantially altering the integrated circuit fabrication processes. However, the use of larger diameter silicon slices is accompanied by several problems.

Aside from the problems in growing or otherwise fabricating six and eight-inch diameter silicon slices, special attention must be directed to the handling of the brittle slices during all fabrication phases to prevent physical damage. Particularly, the larger size silicon slice is more susceptible to fracture or warpage when subjected to the high temperature heating and cooling cycles during integrated circuit fabrication. The temperature gradient generated in silicon slices during heating and cooling causes a hoop stress which can result in crystal damage. Moreover, a warped slice makes subsequent lithography processing difficult, and thus creates a higher probability of unreliable integrated circuits.

During diffusion, oxidation and other integrated circuit fabrication processes, a tray of closely stacked silicon slices is inserted into furnaces at temperatures upwardly of one thousand degrees centigrade. A temperature differential exists radially throughout each silicon slice, the peripherial edges being white hot while the temperature decreases toward the center of the slices. The immediate withdrawal of the silicon slices from the elevated temperature creates severe crystalline stresses within each slice. On many occasions, the crystalline stresses develop into lattice fractures or dislocations, thereby degrading and weakening the slice. Once a dislocation is formed, others tend to agglomerate thereto. It is thus apparent that a single damaged silicon slice may represent the loss of thousands of integrated circuits. While the affects of crystal dislocations are not well understood, there is evidence which indicates that semiconductor junction leakage increases as a result thereof. Also, the dislocations tend to form electron charge generation sites and trap sites.

One approach employed to circumvent the foregoing problems is to slowly insert and withdraw the slices from the furnace in order to prevent a rapid temperature change across the silicon slice. However, to be effective, insertion and withdrawal of the silicon slices must be accomplished over a period ranging up to eighty five minutes. It is apparent that the insertion and withdrawal times are substantial compared with the ten to twenty minutes of actual furnace processing time. The productivity of integrated circuits is thereby diminished.

Another approach taken by those skilled in the art to strengthen silicon semiconductor material is to oxygenate the silicon melt before crystal growth. As a result, oxygen atoms become lodged interstitially between the silicon atoms and create a somewhat hardened material. Oxygenated silicon substrates frequently result in wafer warpage at high temperatures.

From the foregoing, it may be seen that it would be desirable to provide an improved silicon substrate material of increased strength which is less susceptible to breakage or warpage due to lattice dislocations. Such a technique should increase the production yield of integrated circuits formed on such substrates, as well as improve the integrated circuit reliability.

SUMMARY OF THE INVENTION

In accordance with the present invention, a silicon substrate, and method of forming the same, are provided which substantially reduce or eliminate the disadvantages associated with the prior art substrates.

According to the invention, the strength of silicon substrate material is increased by adding high concentrations of germanium impurities to the melt before the silicon crystal is grown. The germanium atoms replace silicon atoms and thus become substitutionally disposed in the silicon crystalline lattice. Germanium atoms are substantially larger than silicon atoms, and thus a high concentration of germanium atoms block or pin crystalline dislocations which may occur as a result of temperature related stresses. The blocked dislocations thereby prevent further propagation or multiplication of such dislocations.

DETAILED DESCRIPTION OF THE INVENTION

In accordance with the invention, a high concentration of germanium is added to the silicon melt to form a hardened semiconductor substrate having a higher strength than substrates heretofore known. The germanium semiconductor material is ideally suited for a hardening agent as the germanium atom is substantially larger than a silicon atom, but is atomically similar. Thus, when introduced into the silicon melt, the germanium atoms readily substitute the silicon atoms in the atomic crystalline structure.

The superior atomic substitutional properties of germanium with respect to silicon are understood best by focusing on the respective atomic structures. Germanium and silicon elements both have four electrons in the $SP^3$ hybrid orbitals. Moreover, the atomic bonds of both materials have the same orientations. This type of atomic bonding is to be distinguished from that of smaller sized oxygen atoms which have two electrons. The oxygen atoms do not replace the silicon atoms, but rather fit into the interstices of the silicon atoms.

As noted above, during the heating and cooling cycles of the silicon substrate slices, various crystal lattice differences form, and result in dislocations, imperfections and slips in the crystalline boundaries. The end result of such crystal defects is a weakened substrate material which is more susceptible to warping or breakage. Once a dislocation is formed, and depending on the degree of misorientation, the fault boundaries may generate various arrays of even more complex defect structures. Because the strength of the silicon crystalline structure is significantly influenced by crystallographic defects, such as dislocations, it is therefore important to either prevent such dislocations in the first instance, or retard the propagation or multiplication thereof once started.

In accordance with an important feature of the invention, a relatively large germanium atom situated within the silicon crystalline structure acts to block the propagation of dislocations which would have otherwise spread through the position occupied by the germanium atom. Thus, with a high concentration of germanium atoms substituted for silicon atoms in the crystalline substrate structure, dislocation or fault patterns are prevented from propagating, thereby greatly increasing the strength of the substrate.

In comparing the relative size of the germanium and silicon atoms, it is relevant to note with regard to ionic radii that the germanium atom is 0.53 Å, while the silicon atom is 0.41 Å. Using the tetrahedral covalent radius as a means of comparison, the germanium atom is 1.22 Å, while the silicon atom is 1.11 Å. In contrast, the covalent radius of an oxygen atom is only 0.73 Å.

It is believed that the substitutional strengthening of a silicon substrate material can be enhanced by adding upwardly of one hundred to one hundred thousand germanium atoms per million silicon atoms, i.e., an average germanium concentration respectively of $5 \times 10^{18}$ to $5 \times 10^{21}$ atoms per cubic centimeter. It is further believed that a range of eight thousand to twelve thousand germanium atoms per million silicon atoms will beneficially strengthen silicon substrates in a majority of applications. Importantly, germanium is also well suited for use as a strengthening agent as its solid solubility in silicon has no upper limit. Therefore, large amounts of germanium can be added to the silicon crystal lattice. Indeed, with a large solubility factor, the silicon crystal may comprise a majority of germanium atoms. Other practical considerations, such as lattice stretching, may dictate that a lower concentration of germanium atoms is ideal. For comparison purposes, the table below lists the solid solubility factors of a few common semiconductor fabrication materials.

germanium—no limit
phosphorus—$10^{21}$ atoms/cm$^3$
bron—$10^{20}$ atoms/cm$^3$
oxygen—$10^{18}$ atoms/cm$^3$ Preferably, a germanium concentration of $10^{18}$ atoms per cubic centimeter of silicon has been found to provide an adequate doping level to noticeably strengthen the silicon substrate material. To be discussed below, higher concentrations may be used when preparing P+ doped substrates.

Because of the low solubility of oxygen, the silicon lattice becomes full with substantially fewer oxygen atoms than compared with germanium atoms. In addition, it has been found that when the level of oxygen atoms in silicon has reached the solubility limit, there is a tendency of the lattice to become distorted. As the oxygenated substrate is heated the oxygen atoms precipitate, thereby causing such distortion. Germanium exhibits none of these shortenings, with the exception that with excessive amounts of added germanium the crystal lattice becomes enlarged, and the energy bandgap is lowered.

It is recognized that with the addition of germanium material to the silicon substrate, the bandgap energy of the resultant substrate is reduced. While this is generally an undesirable characteristic for high temperature electrical operations of the substrate, bandgap considerations of the substrate are of reduced significance when the transistor devices are formed in epitaxial layers deposited on the substrate. With this type of fabrication process the electrical characteristics of the transistor devices are then governed by the makeup of the epitaxial layer. Therefore, inasmuch as the epitaxial process is widely known and used in the fabrication of integrated circuits, the lowered bandgap energy characteristic of the silicon substrate is of lessened importance.

The manner in which the germanium atoms are added to the silicon melt is not critical, and therefore, such atoms can be added according to known principles for preparing a doped substrate material. The Czochralski method may be used, for example, to grow a germanium doped silicon crystal. First, a desired amount of germanium and polycrystalline silicon are introduced into a silica crucible, and melted in the presence of an inert gas or vacuum. Conventional silicon crystal growing crucibles may be used, and particularly the type in which the inert gas is caused to flow in a direction so as to carry off reaction products which are evaporated as a result of the crystal growing process. The temperature of the crucible is maintained at an elevated temperature sufficient to sustain the melt, and the temperature of the crucible, together with the melt, should be in thermal equilibrium throughout the crystal growing process. After the equilibrium temperature is reached, a seed crystal having a slim monocrystal cylindrical shape is dipped into the melt until it begins to melt itself. The seed is then slowly withdrawn by rotating it in an upwardly direction to produce a cylindrical structure. The velocity with which the crystal is pulled is related to the diameter of the cylinder. Moreover, the velocity with which the crystal is raised is increased just before the desired diameter is reached.

When the silicon melt has been substantially depleted, the pulling velocity should be increased to assure a clean separation from the remaining melt, and to reduce the possibilities of creating dislocations within the crystal. However, if the crystal is withdrawn too rapidly, the thermal shock can cause plastic deformation, termed "slip", in the lower part of the crystal. It should be realized that such dislocations and deformations are minimized by the crystal strengthening caused by the germanium atoms. Should dislocations in the bottom part of the crystal yet exist, the Czochralski method of growth permits the in-situ remelting of the crystal. While crystal growing processes are available for growing an essentially dislocation-free crystal, the provision of a high concentration of germanium atoms therein is advantageous for preventing dislocations, or the propagation thereof, during the growing steps, as well as subsequent processing steps. In addition, and as noted above, substrate material fabricated according to the invention provides a durable material less susceptible to breakage or warpage during the processing and handling of the slices.

The use of high concentrations of germanium atoms is also advantageous when used in connection with silicon substrates heavily doped to form P+ substrates. Heavily doped P+ substrates are commonly used as the basic material on which epitaxial layers are grown. The P+ doping is generally achieved by adding boron atoms to the silicon melt. Boron doping concentration levels of $10^{19}$ atoms per cubic centimeter are common. Boron atoms, being smaller than the silicon atoms, have a tendency to shrink the silicon crystalline lattice. However, the germanium atoms have a tendency to expand the crystalline lattice, and therefore offset the shrinkage due to the addition of the boron atoms. When used in connection with boron doped silicon substrates, the germanium doping levels should be increased to about $10^{21}$ atoms per cubic centimeter.

Because of the overall doping levels, the net effect of the lattice shrinkage due to the boron atoms, and the lattice expansion due to the germanium atoms, is a slight reduction in the size of the silicon crystalline lattice. This net shrinkage of the crystalline lattice is not undesirable as, in many instances, the resultant P+ substrate corresponds to the crystalline size of the lightly doped P− epitaxial layers deposited thereon.

From the foregoing, it is seen that a substrate material with enhanced strength is provided. The large germanium atoms substitutionally placed throughout the silicon substrate localize substrate faults and dislocations arising during the cyclical heating of the substrate. Moreover, the high concentration of large germanium atoms offsets the increased crystalline size caused by P+ boron doping, thereby improving the substrate and associated epitaxial layer interface.

Although the preferred embodiment of the invention has been described in detail, it should be understood that various changes, substitutions and alterations can be made therein without departing from the spirit and scope of the invention as defined by the appended claims.

What is claimed is:

1. A method of fabricating a strengthened silicon semiconductor substrate material, comprising the steps of:
    adding to a silicon melt a high concentration of atoms having a size larger than the size of silicon atoms, said atoms being of the type which are substitutionally placed in the crystalline structure of said silicon substrate; and
    growing said stregthened silicon semiconductor substrate material from said melt.

2. The method of claim 1 wherein said adding step comprises adding germanium atoms to the silicon melt.

3. The method of claim 2 wherein the concentration of germanium atoms added is in the range of one hundred to one hundred thousand atoms per million atoms of silicon.

4. The method of claim 2 wherein said concentration of germanium atoms is in the range of eight thousand to twelve thousand atoms per one million silicon atoms.

5. The method of claim 1 further including doping said substrate with boron.

6. The method of claim 5 wherein the doping concentration of boron is about $5 \times 10^{19}$ atoms per cubic centimeter.

7. The method of claim 6 further including forming an epitaxial layer of semiconductor material on said substrate.

8. A method of growing a strengthened silicon crystal, comprising the steps:
    adding polycrystalline silicon to a crucible;
    adding germanium to the crucible;
    heating the crucible, and thus the silicon and germanium, to form a composite melt;
    dipping a monocrystalline silicon seed crystal into said melt; and
    withdrawing said seed from said melt to thereby produce the strengthened silicon crystal.

9. The method of claim 8 wherein said germanium is added in a proportion corresponding to one hundred to one hundred thousand germanium atoms per million silicon atoms.

10. A strengthened monocrystalline semiconductor substrate, comprising:
    a silicon semiconductor material having a number of atoms of another type and of size greater than the atoms of said silicon material, said other atoms numbering more than eight thousand per million atoms of silicon and being substitutionally disposed within the silicon lattice of said material.

11. The semiconductor substrate of claim 10 wherein said atoms comprise germanium atoms.

12. The semiconductor substrate of claim 10 wherein the concentration of said atoms is in the range of eight thousand to ten thousand atoms per million atoms of silicon.

13. The semiconductor substrate of claim 10 wherein said substrate is doped with boron atoms.

14. The semiconductor substrate of claim 13 wherein said substrate includes an epitaxial layer of semiconductor material.

* * * * *